United States Patent
Meiring et al.

(10) Patent No.: US 8,099,684 B2
(45) Date of Patent: Jan. 17, 2012

(54) METHODOLOGY OF PLACING PRINTING ASSIST FEATURE FOR RANDOM MASK LAYOUT

(75) Inventors: Jason E Meiring, Fishkill, NY (US); Henning Haffner, Pawling, NY (US)

(73) Assignees: International Business Machines Corporation, Armonk, NY (US); Infineon Technologies North America Corporation, Milpitas, CA (US)

( * ) Notice: Subject to any disclaimer, the term of this patent is extended or adjusted under 35 U.S.C. 154(b) by 262 days.

(21) Appl. No.: 12/350,251

(22) Filed: Jan. 8, 2009

(65) Prior Publication Data

US 2010/0175040 A1    Jul. 8, 2010

(51) Int. Cl.
*G06F 17/50* (2006.01)
(52) U.S. Cl. .......................................................... 716/50
(58) Field of Classification Search ................ 716/1, 21, 716/100, 50
See application file for complete search history.

(56) References Cited

U.S. PATENT DOCUMENTS

| | | | |
|---|---|---|---|
| 6,875,545 B2 * | 4/2005 | Eurlings et al. | 430/5 |
| 6,929,887 B1 * | 8/2005 | Lin et al. | 430/5 |
| 2004/0209169 A1 * | 10/2004 | Cui et al. | 430/5 |
| 2008/0082952 A1 * | 4/2008 | O'Brien | 716/19 |
| 2009/0079005 A1 * | 3/2009 | Haffner et al. | 257/368 |
| 2009/0181330 A1 * | 7/2009 | Gabor et al. | 430/322 |
| 2010/0122224 A1 * | 5/2010 | Lucas et al. | 716/4 |
| 2010/0293413 A1 * | 11/2010 | Borjon | 714/35 |

OTHER PUBLICATIONS

Manakli, S.; Trouiller, Y.; Toublan, O.; Schiavone, P.; Rody, Y.F. and Goirand, P.J., "Complementary Double Exposure Technique (CODE) solutions to the two-dimensional structures of the 90nm node" Proc. SPIE 4889m 1181-1188 (2002).
Manakli, S.; Trouiller, Y.; Toublan, O.; Schiavone, P.; Rody, Y.F. and Goirand, P.J., "Using the CODE technique to print complex two-dimensional structures in a 90-nm ground rule process," Design and Process Integration for Microelectronic Manufacturing 5042, 205-213, (2003).
Nakao, S. Narimatsu, K.; Miyagi, T. Ogawa, S.; Tamada, N.; Nakae, A.; Tokui, A.; Tsujita, K.; Arimoto, I. and Wakamiya, W.; "Innovative imaging of ultrafine line without using any strong RET," Proc. SPIE 4346, 503-514 (2001).
Trouiller, Y.; Bellendent, J.: Chapon, J.D.; Rousset, V.; Rody, Y. F.; Manakli, S. & Goirand, P., "Gate imaging for 0.09-um logic technology: comparison of single-exposure with assist bars and the CODE approach," Proc. SPIE 5040, 1231-1240, (2003).

* cited by examiner

*Primary Examiner* — Suchin Parihar
(74) *Attorney, Agent, or Firm* — Yuanmin Cai (57) ABSTRACT

Embodiments of the present invention provide a method of placing printing assist features in a mask layout. The method includes providing a design layout having one or more designed features; generating a set of parameters, the set of parameters being associated with one or more printing assist features (PrAFs); adding the one or more PrAFs of the set of parameters to the design layout to produce a modified design layout; performing simulation of the one or more PrAFs and the one or more designed features on the modified design layout; verifying whether the one or more PrAFs are removable based on results of the simulation; and creating a set of PrAF placement rules based on the set of parameters, if the one or more PrAFs are verified as removable. The set of PrAF placement rules may be used in creating a final set of PrAF features to be used for creating the mask layout.

25 Claims, 6 Drawing Sheets

METHODOLOGY OF PLACING PRINTING ASSIST FEATURE FOR RANDOM MASK LAYOUT

FIELD OF THE INVENTION

The present invention relates to resolution enhancement technology (RET) in the field of semiconductor device manufacturing and, in particular, relates to methodology of placing printing assist features in a double patterning process to print semiconductor device features.

BACKGROUND OF THE INVENTION

In semiconductor device manufacturing, photolithography is used in printing features of semiconductor devices onto a wafer whereupon the devices are to be formed. Quality of the patterns or features of the devices printed by the photolithography is generally measured by resolution and particularly by the size of a resolvable half-pitch ($P_{min}/2$). It is well known in the art that the minimum resolvable half-pitch that a photolithographic exposure system may deliver is determined by the Rayleigh criterion, $P_{min}/2 = k_1 \cdot \lambda / NA$, where $\lambda$ is the wavelength of light used in the exposing process, NA is the numerical aperture of the objective lens of the system, and $k_1$ is a process-dependent factor. For decades, resolution of photolithographic exposure systems has steadily improved because of, even though incremental, decreases in $\lambda$, increases in NA, and decreases in $k_1$. For example, historically, the minimum resolvable half-pitch is scaled down by about 30% every two years.

However, single exposure photolithography, which has been the mainstream approach of semiconductor industry, is quickly reaching its physical barrier for continuing to be applied to devices of ever shrinking in size. For example, printing a 22 nm node (with a 32 nm half-pitch) at an NA of 1.35 is becoming almost impossible with a single exposure system simply because the $k_1$ factor will have to drop to around 0.22, which is below the theoretical limit of 0.25 as is known in the art. Unlike all previous generations of photolithography, no next-generation exposure tools with higher NA are expected to be ready or available in time to enable single exposure for 22 nm node production.

As an alternative to single exposure photolithography, double-patterning technology (DPT) is now emerging as a major candidate for printing 22 nm node optically and as a way for easing requirements on printing current 32 nm node. Double patterning technology enables pitches being printed with resolutions smaller than the minimum resolvable half-pitch that a single exposure system can deliver. Even though the theoretical 0.25 limit of $k_1$ factor will still hold, the resulting patterns on the wafer will appear as if a lower $k_1$ has been used. For example, when features at a 60 nm pitch are printed as two interleaved 120 nm pitches, using the so-called "pitch split" approach, even though the actual $k_1$ is 0.42, an effective $k_1$ of 0.21 may be achieved with an objective lens of NA at 1.35.

Double patterning technology may also be used in printing types of features that are at odds with one another in a single exposure process. These types of features are becoming increasingly common as increases in NA—while boosting the depth of focus (DOF) of dense pitches—start to erode the depth of focus of some isolated pitches.

For example, in single exposure schemes, sub-resolution assist features (SRAFs) are usually placed in proximity to isolated features to make them appear denser and to increase their depth of focus. SRAFs are traditionally placed in a layout arranged according to a table of rules that includes, among other things, distance from main features, number of assists to place, and width of the assists. Although SRAFs have historically been a useful tool for increasing process windows of isolated features they are increasingly becoming difficult to be implemented. This is because width of assist features needs to be kept significantly below a minimum feature critical dimension (CD) such that the assist features do not print, hopefully across all possible doses and focus range. As feature CDs continue to shrink, size of SRAFs shrinks as well which makes mask manufacturing and inspection more difficult. Process window may be sufficiently increased only if the SRAF spacing and/or width of the SRAF are set such that printing of assist features occurs. In a single exposure process, printing of these assist features can lead to defects in the patterned structure.

To help mitigate above difficulties relating to SRAF, a double patterning technique, in particular a complementary double exposure (CODE) technique, was first proposed for the 90 nm node. The technique was a double-expose-double-etch ($DE^2$) process during which large extraneous features were printed in a first exposure and then removed in a second exposure. When being printed in the first exposure, the extraneous features were placed adjacent to critical features to improve process windows of the critical features. A variety of themes were explored, but in general the focus of the technique was on improving depth of focus (DOF) of the isolated features by introducing extraneous features that tend to increase the pattern density.

The CODE process in general enhances or improves the effectiveness of extraneous features by allowing these extraneous features to print. As described above, the extraneous features are printed in a first exposure and subsequently removed in a second exposure. Since these extraneous features are no longer "sub-resolution" due to the nature of them being printed, they are generally referred to as printing assist features (PrAFs) in the industry. In a standard optical proximity correction (OPC) process flow, the PrAFs are generally treated like regular features, and receive their respective corrections which may be deemed as appropriate by the OPC process.

In a double exposure scheme, appropriate process and/or methodology are needed in order to separate a design layout into two exposure steps. For example in a CODE scheme, a process, or method, may be developed to add certain PrAF shapes to a mask in one exposure, and to generate trim shapes that will remove the PrAF shapes in a follow-up exposure. This process is generally known as a data decomposition process or step in the overall lithographic process. Generally, a design layout, as being received from a designer, contains no explicit information about how it may be decomposed. Therefore, the data decomposition process, which is normally implemented in data preparation software, needs to create mask layouts for the two exposures. Data decomposition may be trivial for layouts that are one-dimensional (1D), however proper separation or decomposition of random two-dimensional (2D) layouts is generally considered exceedingly difficult, if not impossible. In order to ensure that design layouts are decomposed properly, proper RET and design rules need to be established to prevent any unworkable cases.

Establishment of proper rules for PrAF placement is complicated. It is significantly more complicated than, for example, a SRAF process because a layout designer has many more options to choose from in deciding a proper PrAF placement. For example, rather than being restricted to a limited number of different widths like in a SRAF scheme, PrAFs may be designed with a variety of choices of widths and placement styles that can be adjusted and/or optimized according to, for example, pitches and feature types. A general methodology and/or approach for finding a proper solution, and in some instances optimized solution, from various PrAF options is needed for the lithographic industry relating to recent resolution enhancement technology (RET).

So far, there is no known art that addresses how to place and adjust PrAFs in a double patterning process and addresses how to fit the adjustment of PrAFs into a general data decomposition process. In other words, there is no known art that would enable the use of PrAFs such that they may be applied to layouts using data preparation software.

SUMMARY OF EMBODIMENTS OF THE INVENTION

Embodiments of the present invention provide a method of placing printing assist features in a mask layout. The method includes providing a design layout having one or more designed features; generating a set of parameters, the set of parameters being associated with one or more printing assist features (PrAFs); adding the one or more PrAFs of the set of parameters to the design layout to produce a modified design layout; performing simulation of the one or more PrAFs and the one or more designed features on the modified design layout; verifying whether the one or more PrAFs are removable based on results of the simulation; and, if the one or more PrAFs are verified as removable, creating a set of PrAF placement rules based on the set of parameters.

In one embodiment at least one of the PrAFs are verified as not removable, and the method further includes adjusting the set of parameters associated with the one or more PrAFs; adding the one or more PrAFs of the adjusted set of parameters to the design layout to produce a new modified design layout; performing simulation of the new modified design layout with the one or more PrAFs of the adjusted set of parameters; and verifying whether the one or more PrAFs in the new modified design layout are removable.

In another embodiment the one or more PrAFs are verified as removable, and the method further includes providing a set of process input including information on expected variations of an exposure system; and performing simulation on the modified design layout by applying the set of process input to produce a set of process variability data.

In yet another embodiment, the method includes verifying whether the one or more PrAFs are printable based on the set of process variability data produced by the simulation on the modified design layout, and if at least one of the one or more PrAFs is verified as not printable, returning to adjust the set of parameters associated with the one or more PrAFs to produce a new modified design layout.

According to one embodiment, verifying whether the one or more PrAFs are printable includes verifying whether the one or more PrAFs fail to get printed, get printed too small, or get merged with another PrAF or a designed feature.

In one embodiment the one or more PrAFs are verified as printable, and the method includes calculating a set of performance parameters including depth of focus (DOF), mask error factor (MEF), and across chip line-width variation (ACLV) based upon the set of process input, and evaluating the set of performance parameters against a set of predetermined criteria.

According to one embodiment, the expected variations of the exposure system include variations of at least exposure dose, focus, and mask error. According to another embodiment, performing simulation includes applying an optical proximity correction (OPC) process to the modified design layout to adjust the PrAFs and designed features.

In one embodiment, the method further includes identifying one or more edges of the one or more designed features of the design layout, the one or more edges needing PrAF support based upon the set of PrAF placement rules created; and generating a new set of PrAFs for the identified one or more edges.

In another embodiment, the method includes verifying whether the new set of PrAFs meet design rules and mask rule requirements, and removing one or more PrAFs from the new set of PrAFs if the one or more PrAFs from the new set of PrAFs violate at least one of the design rules and mask rule requirements. According to one embodiment, removing one or more PrAFs from the new set of PrAFs includes merging the one or more PrAFs from the new set of PrAFs with one or more adjacent PrAFs, thereby increasing their combined total area.

In yet another embodiment, the method further includes verifying whether there are more sets of design rules and mask rule requirements needing to be met by the new set of PrAFs, and if all the design rules and mask rule requirements have been met, generating and outputting a final set of PrAFs suitable for creating the mask layout.

BRIEF DESCRIPTION OF THE DRAWINGS

The present invention will be understood and appreciated more fully from following detailed description of the invention, taken in conjunction with the accompanying drawings of which:

FIGS. 5(*a*)-(*c*) are demonstrative illustrations of some parameters that may be adjusted during a process of determining printing assist feature placement rules according to some embodiments of the present invention.

It will be appreciated that for simplicity and clarity of illustration, elements shown in the drawings have not necessarily been drawn to scale. For example, the dimensions of some of the elements may be exaggerated relative to other elements for clarity.

DETAILED DESCRIPTION OF EMBODIMENTS

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

Embodiments of the present invention provide a process or methodology for creating printing assist features (PrAF) which may be added to a design layout in support of a double patterning process. According to one embodiment, an analysis step may be performed to determine a proper, and in certain instances optimized, placement scheme for the PrAF and dimensions thereof, and the determination may be based upon available spaces and/or pitches between designed features.

Since PrAFs are designed to be printed and then removed, there are considerable numbers of placement styles and parameters that may be varied and/or adjusted during a PrAF adjustment process. According to another embodiment of the present invention, PrAFs may be subject to a printability verification using criteria that are, for example, opposite to those used in a regular SRAF process (since SRAFs do not print). Verification may then be performed to ensure that the PrAFs may be removed adequately in a second exposure.

Additionally, embodiment of the present invention provides a data analysis and PrAF placement procedure that fits into an overall data preparation flow that meets current ground rules and process requirements. The data preparation flow starts with an initial design layout, and ends with a photo-mask set that may be used to build proper and/or optimized devices on a wafer. The data analysis and preparation flow may be designed to be compatible with currently existing standard lithographic process, therefore avoiding potential re-architectures of this data preparation flow that would otherwise hinder the mask making process.

Figure 1:
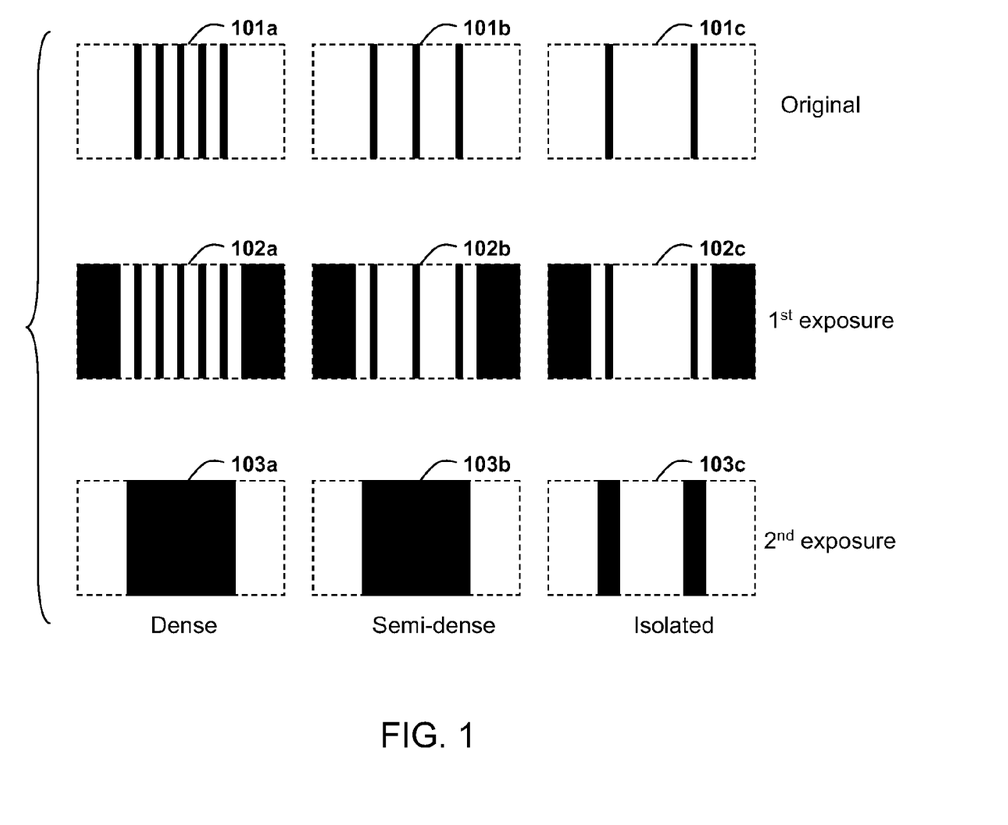
FIG. 1 is a simplified conceptual illustration of a complementary double exposure scheme as is known in the art.

FIG. 1 is a simplified conceptual illustration of a complementary double exposure (CODE) scheme as is known in the art. More specifically, FIG. 1 illustrates three different original layouts 101a, 101b, and 101c having shapes that represent what their respective final design shapes (or design patterns or design features) shall look like. For example, the three different layouts are shown to have a feature of spacing that varies from being dense pitch (101a) to semi-dense or intermediate pitch (101b) to isolated pitch (101c). Hereinafter, layouts 101a, 101b, and 101c may be collectively referred to as layout 101.

As is known in the art, during a process of applying CODE scheme to layout 101, two sets of exposure masks 102 and 103 may initially be created through proper decomposition of layout 101. Hereinafter, the word "set" may include the meaning of one and may be used interchangeably with the phrase "one or more". The first set of mask 102, which collectively refers to masks 102a, 102b, and 102c in FIG. 1, may contain original design features as well as newly created PrAF shapes that, in the present example as illustratively shown in FIG. 1, are added to the outside edges of the feature array. During a first exposure, the original features as well as the PrAF shapes may be printed on a semiconductor wafer upon which final design shapes will be formed. The second set of mask 103, which collectively refers to masks 103a, 103b, and 103c in FIG. 1, may contain features or trim shapes (shown by the white areas in FIG. 1) that may be used in a second exposure to erase the PrAF shapes that are printed during the first exposure. In FIG. 1, shapes shown by black areas in the second set of mask 103 are designed to protect the original design features from being erased during the second exposure. By performing the above two separate exposures, the original design shapes or features are printed on the semiconductor wafer, and the features are printed more robustly than those that may be achieved with a single exposure process.

Figure 2:
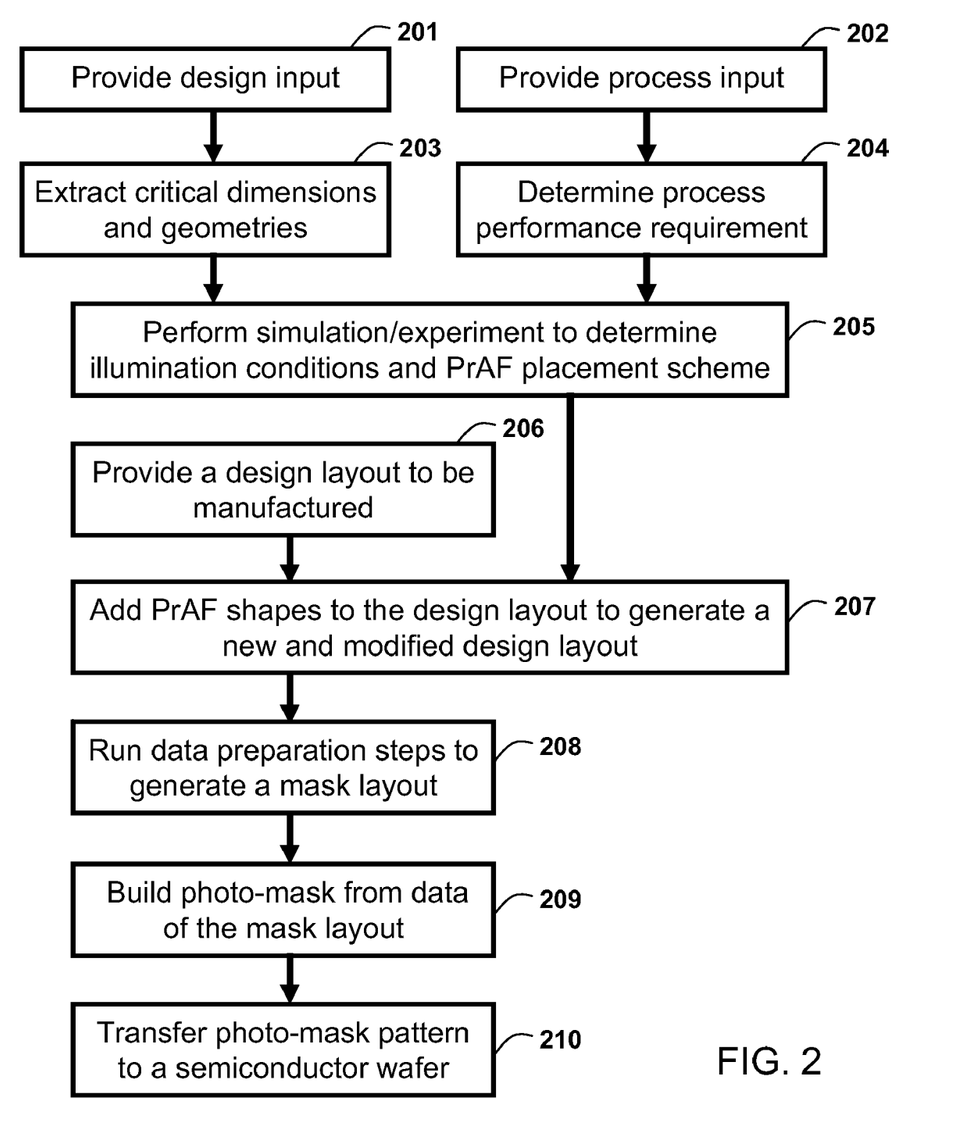
FIG. 2 is a demonstrative flow-chart illustration of a method of placing printing assist features and performing related data preparation according to one embodiment of the present invention.

FIG. 2 is a demonstrative flow-chart illustration of a method of placing printing assist features and performing related data preparation according to one embodiment of the present invention. In order to create a final mask or mask set that may be used to fabricate actual semiconductor devices, placement of PrAF shapes shall be first determined and preparation of associated design data be performed. According to one embodiment, method of the present invention may start with providing design input 201 and process input 202 to a process. Design input 201 may include, for example, description of what is allowed and what is not allowed to be drawn in a design layout, commonly known as "design rules". The use of "design rules" as at least part of design input 201 is commonly practiced in the art. The "design rules" are generally described in a design manual and may include for example how closely two drawn features may be spaced, minimum and maximum feature widths, how features in one level may be placed in relation to features on other levels, etc. Process input 202 may include detailed description of limitations or expected variations of the lithography process and/or system that will be used and may include, for example, capability of the exposure tool such as wavelength of exposing light, dose, focus, numerical aperture, mask variation, performance of photo-resist, process variation, etc.

Next, one embodiment of the method may include extracting critical dimensions (CDs) of features and/or geometries, at step 203, which may need adjustment and/or optimization from design input 201. These features and/or geometries may include those of the semiconductor devices, PrAFs shapes, and other features such as SRAFs. For example, the design manual provided at step 201 may not include or explicitly state what these critical dimensions and geometries are, for a given design layout, or which elements in the design layout may be related to the construction of PrAF placement rules. More specifically, in a process for gate level design, there are usually separate rules for features used for creating transistor gates and for features used for wiring between transistor gates. Gate related features typically have much tighter tolerance requirements and are thus a much more important target for adjustment and/or optimization than wiring related features. This type of information and/or design rules may need to be derived or extracted at step 203. In addition, step 203 may extract information such as, for example, pitch, space, 2D configurations, etc.

Similarly at step 204, based upon information provided by process input 202, certain process performance requirement or target conditions of the exposure process that may help print features within tolerance will be decided. For example, if process input 202 indicates that mask variation is generally large, it is then decided that mask error factor (MEF) of the exposure process may need to be kept low in order to avoid large CD variations on the wafer. Keeping low MEF may be achieved by, for example, selecting proper illumination conditions and/or exposure dose, and in some instances by applying polarized light source for exposure.

In a gate level process, a total CD variation on the wafer, known as across chip line-width variation (ACLV) and caused by for example mask variation, focus variation, and dose variation, shall be considered in determining process performance requirement. In other levels of processes, different metrics such as depth of focus (DOF) or a combination of DOF, ACLV and/or other metrics such as those described above may become important. Generally, it is a complicated process of applying metrics in determining process performance requirement for double patterning processes of PrAFs. These metrics are used to adjust, and in some instances optimize, printing of both designed features and PrAFs with different printing criteria. For example, designed features generally have more stringent tolerance requirement or printing criteria than those used for the PrAFs. According to embodiment of the present invention, additional step or steps may be introduced to be applied in PrAF adjustment process, as being described below in more details with reference to FIG. 3.

In a double patterning process, the numbers of process input may be dramatically increased or even doubled versus a single exposure process simply because the two exposure steps or processes in a double patterning process are independent of each other. In addition, process limitations of the second patterning step or process may affect those limitations of the first patterning step or process in particular with regard to the removal of PrAFs. Therefore, according to one embodiment of the present invention, limitations of the second exposure step or process may include those from performing PrAF removal check or verification, as being described below in more details with reference to FIG. 3.

With critical dimensions (CD) and geometry information being extracted at step 203, and process performance requirement being decided at step 204, one embodiment of the method may include applying a process to identify a reasonable, and in some instances optimal (or close to optimal), illumination condition for the lithographic exposure tool and determine PrAF placement scheme at step 205. The process may be a systematic OPC simulation process and/or experimental process, details of which are described below in details with reference to FIG. 3. Reasonable, and in some instances optimal or close to optimal, illumination conditions identified at step 205 may include for example requirements or conditions for numeral aperture (NA), shape of light source, pupil polarization, dose, etc. of the exposure tool used for the photolithography process. The PrAF placement scheme provided at step 205 may help achieve most of the process requirements while simultaneously meeting the design ground rules. As described above, the target of performing PrAF analysis at step 205 is to determine the amount of, for example, MEF, ACLV, and/or certain combination thereof with a focus on features with CDs and geometries that are determined at step 203. At the output of step 205, width and placement scheme for the PrAFs may be tabulated into a set of rules, which are grouped by pitch or spacing of designed features, to be used in other steps.

Having created a set of rules or placement scheme for designed features, PrAFs, and others features such as for example SRAFs, one embodiment of the method may include a placement step 207 of applying these rules or placement scheme to add or provide PrAFs to a design layout that is provided at step 206 to be manufactured. In the placement step 207, data preparation software may be used optionally, for efficiency purpose only, to analyze the design layout with other PrAF and for example SRAF features being added, and to apply the PrAF rules in an automated way based upon the placement scheme or rules that are tabulated in the previous step. The PrAF placement step 207 may produce a modified new design layout that contains both the designed features and the PrAFs, as being described below in more details with reference to FIG. 4.

In a next step 208, the modified new design layout may be processed through a series of data preparation steps that ultimately create a final mask design or mask layout. Among the series of data preparation steps may include, for example, design modification like sizing operations, creation of removal shapes for the PrAFs, OPC operation and/or simulation, and decomposition of the design layout into two mask layouts.

In a next step 209, one embodiment of the method may include applying the mask layout produced at step 208 to build photo-masks, and subsequently at a step 210 using the photo-masks to create device patterns, such as applying a photolithographic process to transfer the photo-mask pattern to a semiconductor wafer upon which the semiconductor devices will be formed. The device patterns produced on the semiconductor wafer are properly adjusted and in some instances optimized or close to optimized according to embodiment of the present invention.

Figure 3:
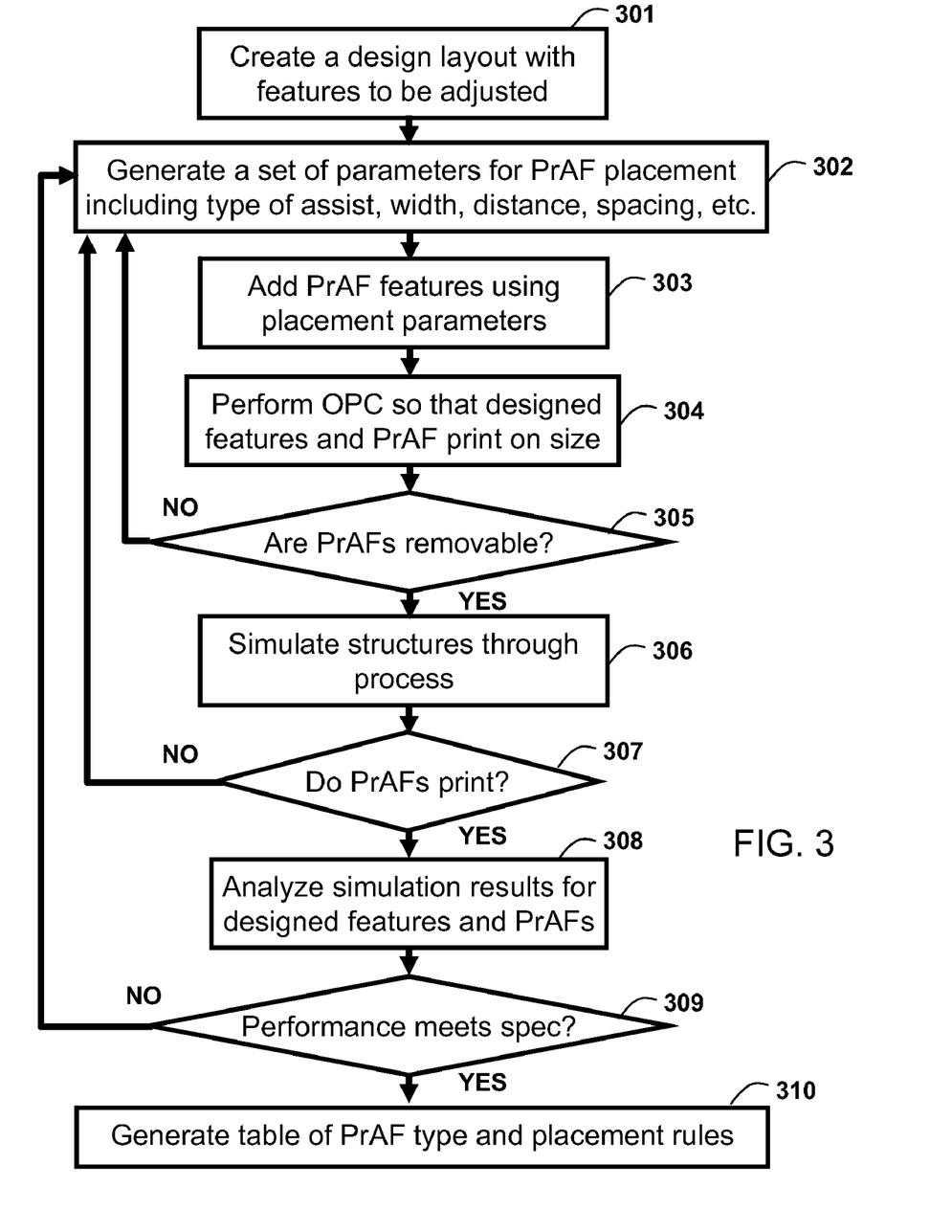
FIG. 3 is a demonstrative flow-chart illustration of a method of performing analysis and adjustment of printing assist features in a double patterning process according to some embodiments of the present invention.

FIG. 3 is a demonstrative flow-chart illustration of a method of performing analysis and adjustment of printing assist features in a double patterning process according to some embodiments of the present invention. For example, the method may include a step 301 of creating a design layout that contains a set of designed features whose printing or placement may need adjustment. Hereinafter, for simplicity without losing generality, features discussed in the following will be limited to one-dimensional design features with systematic variation of width and pitch (or spacing) between the features. However, a person skilled in the art will appreciate that embodiments of the present invention are not limited in this respect and may be applied to design layouts with a set of multi-dimensional, e.g., two-dimensional, designed features.

In a next step 302, one embodiment of the method may include generating a set of parameters which determine the placement of PrAFs. Configuration and/or parameters for the PrAFs may be determined and/or selected by taking into consideration existing advantages of the illumination system that will be used in the exposure process. In the following, to provide some demonstrative examples, a few of the parameters are described below in more details with reference to FIG. 5. These parameters may be arranged in either the form of a look-up table, or a mathematical formula, with variation based on width and pitch of the designed features. It is anticipated and understood that the number of parameters for PrAF placement may be considerably more than those for SRAF in a single exposure process.

In a next step 303, one embodiment of the method may include providing or adding features of PrAFs to the set of designed features using parameters that are formulated in the previous step 302. With PrAFs being added onto the set of designed features in the design layout, thus a modified design layout, embodiment of the present invention may include, in a next step 304, performing an optical proximity correction (OPC) simulation on the modified design layout to resize and/or reshape both the designed features and the PrAFs such that the designed features and the PrAFs may print as being intended. In other words, during the OPC simulation, the PrAFs may be corrected along with the designed features to ensure that both will print properly.

In a next step 305 of post-OPC process, one embodiment of the method may include verifying that the shapes of PrAFs may be properly removed by a following patterning step, which may be a second exposure process that is complimentary to the first exposure process, (thus a complementary exposure process or CODE). In other words, the method may proceed to determine whether the PrAFs are removable at step 305. The determination may be made based upon process input provided at step 202 of FIG. 2, and may take into consideration of other effects such as overlay and corner rounding. During verification if, for example, the PrAFs are deemed too big, or too small, or too close to a designed feature such that they may not be fully removed, one embodiment of the method may include returning back to step 302 to repeat the process steps 302, 303, and 304 with a new set of PrAF placement parameters.

In the next step 306, designed features and PrAFs generated by the above OPC process are used, together with expected process variations including dose, focus, and mask errors of process input provided at step 202 (FIG. 2), to simulate critical dimension data for each simulation condition through the process of the lithographic exposure. For example, a set of process variability data may be simulated. Results of the simulation may be provided for analysis at a next step 307, which determines whether PrAFs will be printed properly. Here, since PrAF printing is desirable or is designed to be printed, any identification of a PrAF that fails to print, prints too small, or may potentially merge with another PrAF or designed feature shall be considered as the process failing the printability determination. According to one embodiment of the method, if any PrAF fails the printability determination at step 307, the method may return the process back to step 302 to repeat the process steps 302, 303, 304, 305, and 306.

On the other hand, if the design features and PrAFs pass the printability determination or verification at step 307, according to one embodiment of the method, the simulation results may be analyzed a next step 308 which includes calculation of, for example, depth of focus (DOF), mask error factor (MEF), and across chip line-width variation (ACLV) based on process assumptions provided at step 202 (FIG. 2), and based on the calculated results the effectiveness of the double patterning process may be evaluated. The evaluation may be performed for both the designed features and the PrAFs, and possibly for other features such as SRAFs as well. Here, it shall be noted that criteria used for evaluation of the PrAFs will generally be different from those used for the designed features because PrAFs and designed features typically have different tolerance requirements. For example, DOF criteria used for valuation of PrAF may be looser and may tolerate for example a larger CD variation, as being compared with those used for designed features.

In a next step 309, results obtained at step 308 may be compared with the process requirement for all designed features in the layout. According to one embodiment of the present invention, requirements for PrAFs must be considered along with requirements for designed features. If one or more process requirements are not met, then one embodiment of the method includes returning the process to step 302 to repeat steps 303 to 308, as described above, with a new set of PrAF placement parameters.

On the other hand, if all, or at least majority of, the process requirements are met, embodiment of the method may proceed to generate a table of PrAF types and create PrAF placement scheme or rules at next step 310. The identified PrAF parameters may be placed or organized into a tabulated form or mathematical formula, and/or used by data preparation software to perform automated placement during an OPC process.

Figure 4:
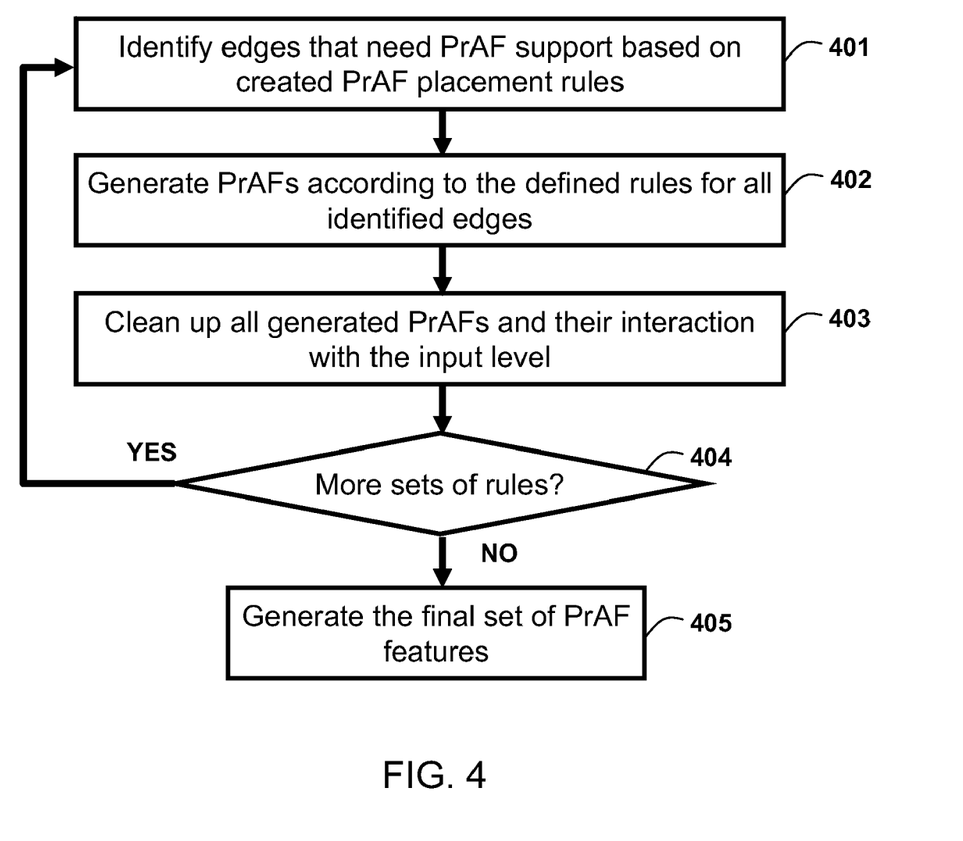
FIG. 4 is a demonstrative flow-chart illustration of a method of providing printing assist features to a design layout to generate a modified design layout according to some embodiment of the present invention.

FIG. 4 is a demonstrative flow-chart illustration of a method of providing printing assist features to a design layout to generate a modified design layout according to some embodiment of the present invention. More specifically, FIG. 4 is a detailed illustration of PrAF placement flow as being denoted at step 207 of FIG. 2. For example, during a process of creating a photo-mask, a design layout may first be provided at step 206 of FIG. 2. With the provided design layout, edges of designed features in the design layout, which require PrAF and/or SRAF support, may be identified or determined at step 401. The identification may be based upon PrAF placement rules created previously, such as those being tabulated at steps shown in FIG. 3. Each edge of the designed features may be considered separately, thus providing individualized and in some instances optimized support. For example, a feature may be isolated on one edge but in close proximity to another feature on another edge. Depending on the rule table, each edge may receive separate PrAF and/or SRAF placement.

In a next step 402, one embodiment of the method includes using the PrAF rule table to place PrAFs for the identified edges such as applying the defined width and rules of placement on each edge of the features requiring PrAF support. Next, a clean-up step 403 may be performed in which the placed PrAFs are verified to make sure that they satisfy all the design rules and mask rule requirements. Any violating PrAFs may be removed or modified to ensure that all the rules are obeyed. For example, in a random 2D layout, there are often situations where two PrAFs or one PrAF and one SRAF may be placed too close to one another, or may be too close to a designed feature. Accordingly as part of this clean-up step 403, distances between these PrAFs or between a PrAF, a SRAF, and a designed feature may be increased. Alternatively, a minimum area check may be performed for PrAFs. The minimum area check may be made based on process inputs wherein the minimum area is the area of a PrAF shape that will allow the PrAF to be printed. According to one embodiment, PrAFs that have an area under this requirement may be removed or merged with adjacent PrAFs to increase their combined total area. In other words, at step 403, all the generated PrAFs are cleaned up, including their interactions with the input level.

In the above discussion, a person skilled in the art will appreciate that even though in some instances, the placed PrAFs may not satisfy all the design rules and/or mask rule requirement, and in some other instances not all the violating PrAFs are removed or modified to obey all the rules, some compromised design layout may still be obtained according to certain embodiment of the present invention.

In a next step 404, one embodiment of the method includes performing a verification or confirmation to verify whether there are additional sets of rules that need to be applied and satisfied by the PrAFs. In some instances, these additional rules may be applicable only after an initial set of PrAFs has been placed. If additional rules exist, then embodiment of the method may return the process to step 401 to identify edges that need to get PrAF support based on these existing additional rules. Otherwise, if it is determined at step 404 that all the rules have been applied, then the method may advance the PrAF placement process to precede to a step 405 that generates the final set of PrAF features. Embodiment of the method may provide or output the final set of PrAFs or PrAF features, which may be suitable to be added to the design layout to produce, together with the designed features, a mask layout.

Figure 5A:
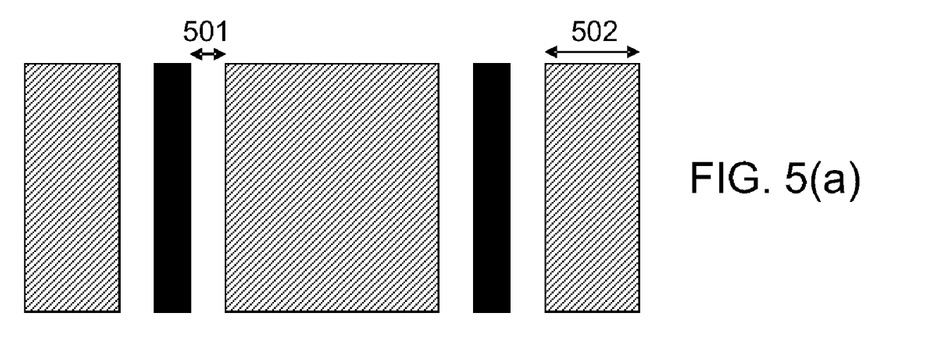
Figure 5B:
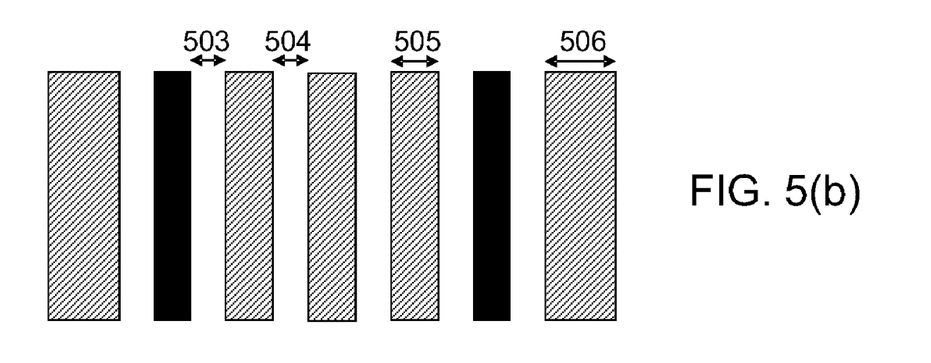
Figure 5C:
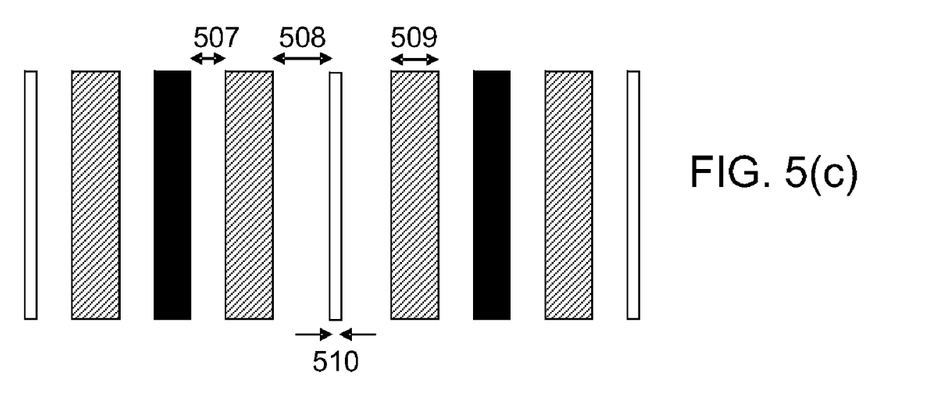

FIGS. 5(*a*)-(*c*) are demonstrative illustrations of some parameters that may be adjusted during a process of determining printing assist feature placement rules according to some embodiment of the present invention. In FIGS. 5(*a*)-(*c*), solid black areas represent designed features of the device that are intended to be manufactured; semi-shaded areas represent PrAFs; and un-shaded areas represent SRAFs. More specifically, 501, 503, and 507 denote parameters of spacing between a designed feature and a PrAF; 502, 505, 506, and 509 denote the exterior width of a PrAF; 504 denotes a PrAF-to-PrAF spacing; 508 denotes a PrAF-to-SRAF spacing; and 510 denotes the exterior width of a SRAF. In addition to the above, the type of parameters for adjustment during a PrAF placement may also include the number of PrAFs used between and outside the designed features. Here, it is worth noting that FIGS. 5(a)-(c) are intended to illustrate the complexity that a PrAF adjustment process may entail, in particular when it is compounded with the placement of SRAF. As a result, a final placement scheme may sometimes become quite elaborative. In general, parameters may be chosen such that they can be relatively easily formulated in the adjustment and/or optimization loop.

Figure 6:
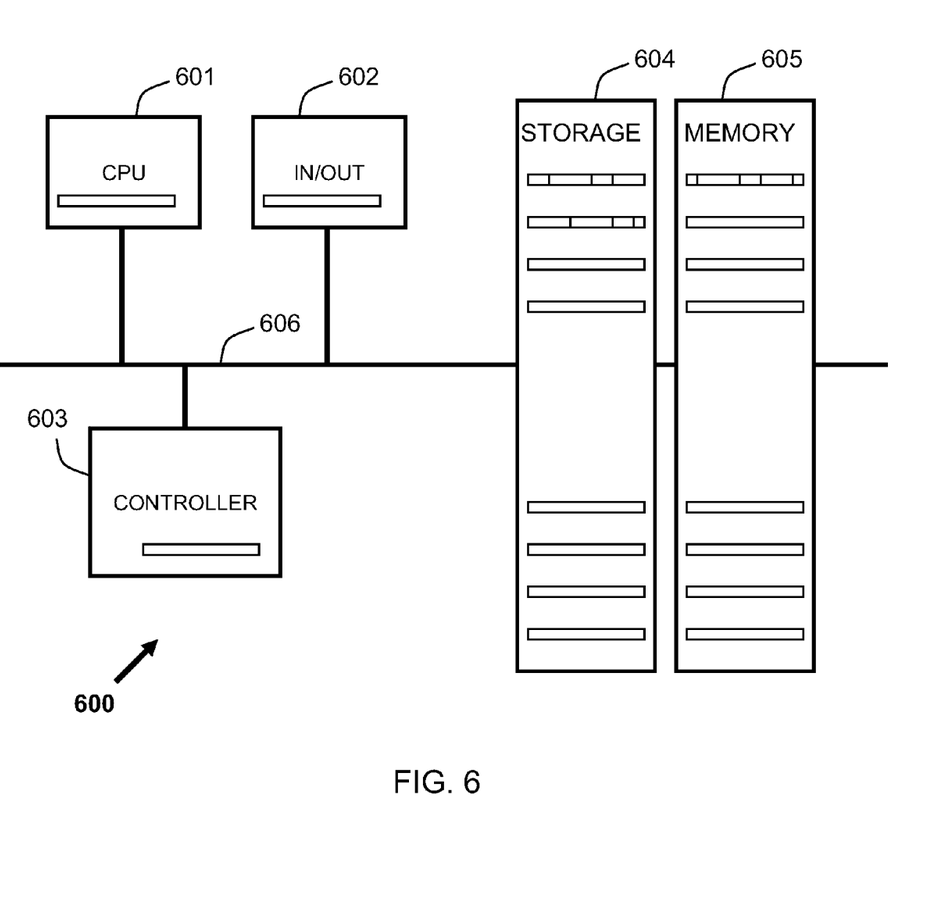
FIG. 6 is a simplified diagram illustration of a computing system implemented with the method according to embodiments of the present invention.

Method of PrAF placement, according to embodiments of the present invention, may be implemented in a machine, a computer, or a computing system. For example, FIG. 6 is a simplified diagram illustration of a computer or computing system 600 implemented with the above method according to one embodiment of the present invention. Computer or computing system 600 may include, inter alia, a central processing unit (CPU) 601 for data processing; one or more input/output (I/O) devices 602 such as, for example, a keyboard, a mouse, a compact disk (CD) drive, a display device, or a combination thereof or the like for accepting instructions and/or input from an operator or user and for outputting results from CPU 601 that processes data during simulation or computation; a controller 603 capable of controlling operation of computing system 600; one or more storage devices or media 604 capable of reading and/or writing computer readable code; and a memory device or medium 605—all of which are operationally connected, e.g., via a bus or a wired or wireless communication network (606). Furthermore, embodiments of the present invention may be implemented as a computer program product stored on a computer readable medium such as, for example, storage device 604 or memory device 605. The computer program product or machine-readable medium may contain instructions which, when being executed, may implement embodiments of the method according to present invention on computing system 600. Finally, the present invention can also be implemented in a plurality of distributed computers where the present items may reside in close physical proximity or distributed over a large geographic region and connected by a communications network.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of placing printing assist features in a mask layout, the method comprising:
    providing a design layout having one or more designed features;
    generating a set of parameters, said set of parameters being associated with one or more printing assist features (PrAFs);
    adding said one or more PrAFs of said set of parameters to said design layout to produce a modified design layout;
    using a computer to perform simulation of said one or more PrAFs and said one or more designed features on said modified design layout;
    verifying whether said one or more PrAFs are removable based on results of said simulation; and
    creating a set of PrAF placement rules based on said set of parameters, if said one or more PrAFs are verified as removable.

2. The method of claim 1, further comprising, if at least one of said PrAFs are verified as not removable:
    adjusting said set of parameters associated with said one or more PrAFs;
    adding said one or more PrAFs of said adjusted set of parameters to said design layout to produce a new modified design layout;
    performing simulation of said new modified design layout with said one or more PrAFs of said adjusted set of parameters; and
    verifying whether said one or more PrAFs in said new modified design layout are removable.

3. The method of claim 1, further comprising, if said one or more PrAFs are verified as removable, providing a set of process input including information on expected variations of an exposure system; and
    performing simulation on said modified design layout by applying said set of process input to produce a set of process variability data.

4. The method of claim 3, further comprising verifying whether said one or more PrAFs are printable based on said set of process variability data produced by said simulation on said modified design layout, and if at least one of said one or more PrAFs is verified as not printable, returning to adjust said set of parameters associated with said one or more PrAFs to produce a new modified design layout.

5. The method of claim 4, wherein verifying whether said one or more PrAFs are printable comprises verifying whether said one or more PrAFs fail to get printed, get printed too small, or get merged with another PrAF or a designed feature.

6. The method of claim 4, further comprising, if said one or more PrAFs are verified as printable, calculating a set of performance parameters including depth of focus (DOF), mask error factor (MEF), and across chip line-width variation (ACLV) based upon said set of process input, and evaluating said set of performance parameters against a set of predetermined criteria.

7. The method of claim 3, wherein said expected variations of said exposure system comprise variations of at least exposure dose, focus, and mask error.

8. The method of claim 1, wherein performing simulation comprises applying an optical proximity correction (OPC) process to said modified design layout to adjust said one or more PrAFs and said one or more designed features.

9. The method of claim 1, further comprising:
    identifying one or more edges of said one or more designed features of said design layout, said one or more edges needing PrAF support based upon said set of PrAF placement rules created; and
    generating a new set of PrAFs for said identified one or more edges.

10. The method of claim 9, further comprising verifying whether said new set of PrAFs meet design rules and mask rule requirements, and removing one or more PrAFs from said new set of PrAFs if said one or more PrAFs from said new set of PrAFs violate at least one of said design rules and mask rule requirements.

11. The method of claim 10, wherein said removing one or more PrAFs from said new set of PrAFs comprises merging said one or more PrAFs from said new set of PrAFs with one or more adjacent PrAFs, thereby increasing their combined total area.

12. The method of claim 11, further comprising verifying whether there are more sets of design rules and mask rule requirements needing to be met by said new set of PrAFs, and if all the design rules and mask rule requirements have been met, generating and outputting a final set of PrAFs suitable for creating the mask layout.

13. A system for producing printing assist features, said system comprising:
   a central processing unit (CPU);
   at least one input/output device for interacting with a user of said system;
   at least one storage device for storing a set of instructions; and
   a controller for controlling said CPU; said at least one input/output device;
and said at least one storage device via a communication bus, wherein said CPU is adapted to execute said set of instructions for:
   providing a design layout having one or more designed features;
   generating a set of parameters, said set of parameters being associated with one or more printing assist features (PrAFs);
   adding said one or more PrAFs of said set of parameters to said design layout to produce a modified design layout;
   performing simulation of said one or more PrAFs and said one or more designed features on said modified design layout;
   verifying whether said one or more PrAFs are removable based on results of said simulation; and
   creating a set of PrAF placement rules based on said set of parameters, if said one or more PrAFs are verified as removable.

14. The system of claim 13, wherein executing said set of instructions by said CPU further comprising, if at least one of said PrAFs are verified as not removable:
   adjusting said set of parameters associated with said one or more PrAFs;
   adding said one or more PrAFs of said adjusted set of parameters to said design layout to produce a new modified design layout;
   performing simulation of said new modified design layout with said one or more PrAFs of said adjusted set of parameters; and
   verifying whether said one or more PrAFs in said new modified design layout are removable.

15. The system of claim 13, wherein executing said set of instructions by said CPU further comprising, if said one or more PrAFs are verified as removable,
   providing a set of process input including information on expected variations of an exposure system; and
   performing simulation on said modified design layout by applying said set of process input to produce a set of process variability data.

16. The system of claim 15, wherein executing said set of instructions by said CPU further comprising verifying whether said one or more PrAFs are printable based on said set of process variability data produced by said simulation on said modified design layout, and if at least one of said one or more PrAFs is verified as not printable, returning to adjust said set of parameters associated with said one or more PrAFs to produce a new modified design layout.

17. The system of claim 16, wherein verifying whether said one or more PrAFs are printable comprises verifying whether said one or more PrAFs fail to get printed, get printed too small, or get merged with another PrAF or a designed feature.

18. The system of claim 16, wherein executing said set of instructions by said CPU further comprising, if said one or more PrAFs are verified as printable, calculating a set of performance parameters including depth of focus (DOF), mask error factor (MEF), and across chip line-width variation (ACLV) based upon said set of process input, and evaluating said set of performance parameters against a set of predetermined criteria.

19. The system of claim 13, wherein performing simulation comprises applying an optical proximity correction (OPC) process to said modified design layout to adjust said one or more PrAFs and said one or more designed features.

20. A non-transitory machine-readable storage medium having stored thereupon a set of instructions that, when executed by a machine, result in:
   providing a design layout having one or more designed features;
   generating a set of parameters, said set of parameters being associated with one or more printing assist features (PrAFs);
   adding said one or more PrAFs of said set of parameters to said design layout to produce a modified design layout;
   performing simulation of said one or more PrAFs and said one or more designed features on said modified design layout;
   verifying whether said one or more PrAFs are removable based on results of said simulation; and
   creating a set of PrAF placement rules based on said set of parameters, if said one or more PrAFs are verified as removable.

21. The non-transitory machine-readable storage medium of claim 20, wherein said set of instructions further result in, if at least one of said PrAFs are verified as not removable:
   adjusting said set of parameters associated with said one or more PrAFs;
   adding said one or more PrAFs of said adjusted set of parameters to said design layout to produce a new modified design layout;
   performing simulation of said new modified design layout with said one or more PrAFs of said adjusted set of parameters; and
   verifying whether said one or more PrAFs in said new modified design layout are removable.

22. The non-transitory machine-readable storage medium of claim 20, wherein said set of instructions further result in, if said one or more PrAFs are verified as removable,
   providing a set of process input including information on expected variations of an exposure system; and
   performing simulation on said modified design layout by applying said set of process input to produce a set of process variability data.

23. The non-transitory machine-readable storage medium of claim 22, wherein said set of instructions further result in verifying whether said one or more PrAFs are printable based on said set of process variability data produced by said simulation on said modified design layout, and if at least one of said one or more PrAFs is verified as not printable, returning to adjust said set of parameters associated with said one or more PrAFs to produce a new modified design layout.

24. The non-transitory machine-readable storage medium of claim 23, wherein verifying whether said one or more PrAFs are printable comprises verifying whether said one or more PrAFs fail to get printed, get printed too small, or get merged with another PrAF or a designed feature.

25. The non-transitory machine-readable storage medium of claim 23, wherein said set of instructions further result in, if said one or more PrAFs are verified as printable, calculating a set of performance parameters including depth of focus (DOF), mask error factor (MEF), and across chip line-width variation (ACLV) based upon said set of process input, and evaluating said set of performance parameters against a set of predetermined criteria.

* * * * *